United States Patent
Müller et al.

(10) Patent No.: US 9,787,055 B2
(45) Date of Patent: Oct. 10, 2017

(54) SEMICONDUCTOR STRIP LASER AND SEMICONDUCTOR COMPONENT

(71) Applicant: OSRAM Opto Semiconductors GmbH, Regensburg (DE)

(72) Inventors: Jens Müller, Regensburg (DE); Alfred Lell, Maxhütte-Haidhof (DE); Uwe Strauβ, Bad Abbach (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/119,546

(22) PCT Filed: Mar. 23, 2015

(86) PCT No.: PCT/EP2015/056083
§ 371 (c)(1),
(2) Date: Aug. 17, 2016

(87) PCT Pub. No.: WO2015/154975
PCT Pub. Date: Oct. 15, 2015

(65) Prior Publication Data
US 2017/0054271 A1    Feb. 23, 2017

(30) Foreign Application Priority Data
Apr. 11, 2014   (DE) .................. 10 2014 105 191

(51) Int. Cl.
*H01S 5/024*   (2006.01)
*H01S 5/022*   (2006.01)
(Continued)

(52) U.S. Cl.
CPC ........ *H01S 5/02476* (2013.01); *H01S 5/0224* (2013.01); *H01S 5/02469* (2013.01);
(Continued)

(58) Field of Classification Search
CPC .. H01S 5/02476; H01S 5/02469; H01S 5/222; H01S 5/0425; H01S 5/32341;
(Continued)

(56) References Cited

U.S. PATENT DOCUMENTS

2002/0074556 A1    6/2002   Kwak et al.
2003/0128729 A1    7/2003   Matsumura
(Continued)

FOREIGN PATENT DOCUMENTS

EP    1005123 A2    5/2000
EP    1906496 A2    4/2008
(Continued)

OTHER PUBLICATIONS

Holc, K. et al., "(Al, in)GaN Laser Diodes With Optimized Ridge Structures," Proc. of SPIE, 2012, vol. 8277, pp. 82770H1-82770H7.
(Continued)

*Primary Examiner* — Dung Nguyen
(74) *Attorney, Agent, or Firm* — Slater Matsil, LLP

(57) ABSTRACT

A semiconductor strip laser and a semiconductor component are disclosed. In embodiments the laser includes a first semiconductor region of a first conductivity type of a semiconductor body, a second semiconductor region of a second different conductivity type of the semiconductor body, at least one active zone of the semiconductor body configured to generate laser radiation between the first and second semiconductor regions. The laser further includes a strip waveguide formed at least in the second semiconductor region and providing a one-dimensional wave guidance along a waveguide direction of the laser radiation generated in the active zone during operation, a first electric contact on the first semiconductor region, a second electric contact on the second semiconductor region and at least one heat spreader dimensionally stably connected to the semiconduc-
(Continued)

tor body at least up to a temperature of 220° C., and having an average thermal conductivity of at least 50 W/m·K.

20 Claims, 8 Drawing Sheets

(51) Int. Cl.
*H01S 5/042* (2006.01)
*H01S 5/323* (2006.01)
*H01S 5/16* (2006.01)
*H01S 5/22* (2006.01)

(52) U.S. Cl.
CPC .......... *H01S 5/0425* (2013.01); *H01S 5/222* (2013.01); *H01S 5/2226* (2013.01); *H01S 5/32341* (2013.01); *H01S 5/02484* (2013.01); *H01S 5/168* (2013.01); *H01S 5/2214* (2013.01); *H01S 2301/176* (2013.01)

(58) Field of Classification Search
CPC ...... H01S 5/0224; H01S 5/2226; H01S 5/168; H01S 5/02484; H01S 2301/176
See application file for complete search history.

(56) References Cited

U.S. PATENT DOCUMENTS

| | | | |
|---|---|---|---|
| 2009/0219966 A1* | 9/2009 | Tan | ........................ B82Y 20/00 372/43.01 |
| 2014/0140362 A1 | 5/2014 | Masui et al. | |

FOREIGN PATENT DOCUMENTS

| | | |
|---|---|---|
| JP | 3232680 A | 9/1997 |
| JP | 2003158343 A | 5/2003 |
| JP | 2007311682 A | 11/2007 |
| JP | 2013229417 A | 11/2013 |
| WO | 2013005759 A1 | 1/2013 |

OTHER PUBLICATIONS

Möller, E.: "Handbuch Konstruktionswerkstoffe, Auswahl, Eignschaften, Anwendung," 2008, 1 page.

* cited by examiner

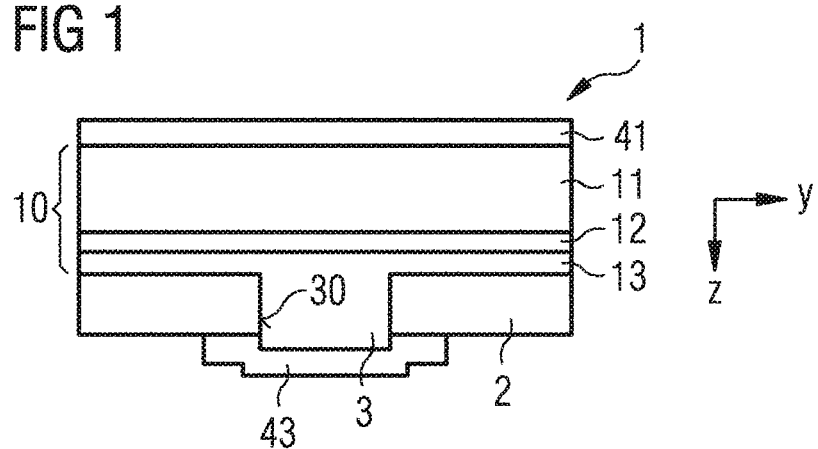
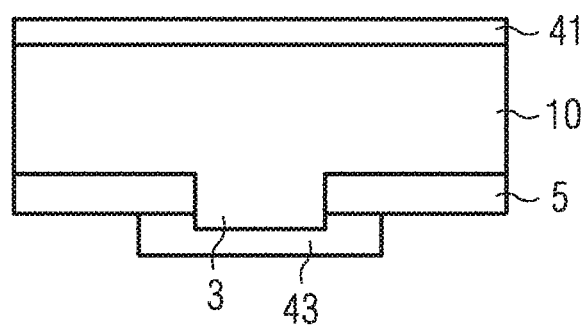
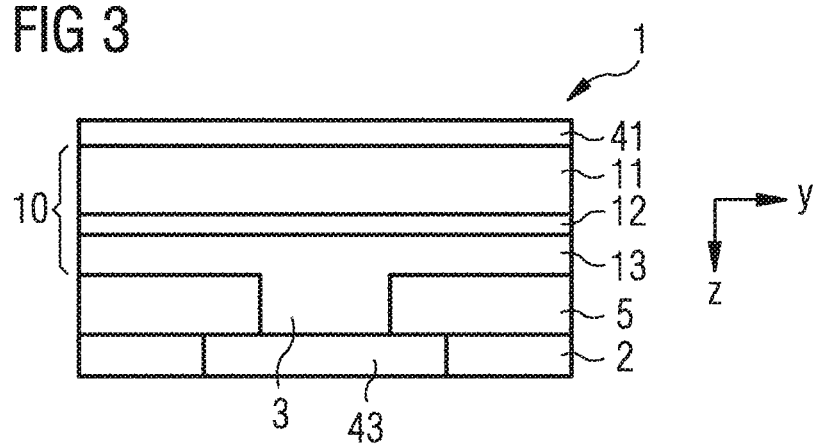

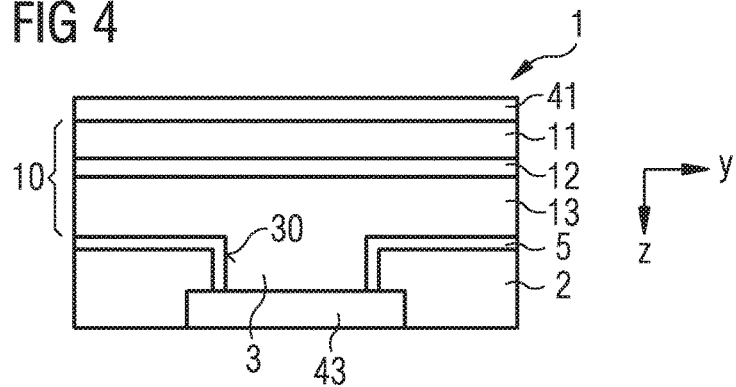
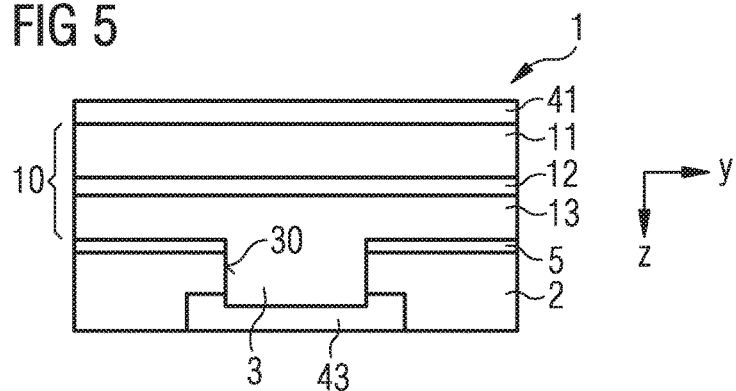
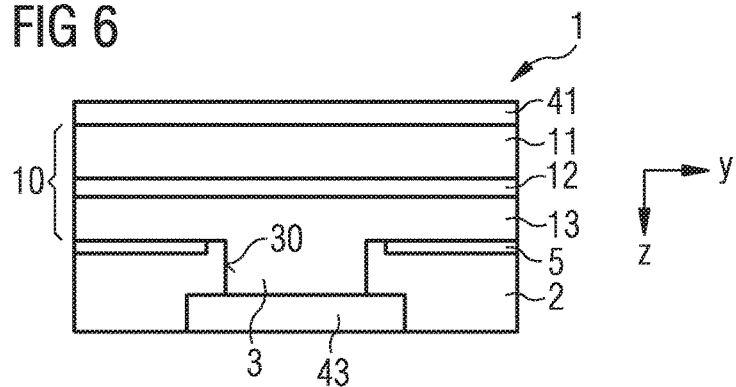
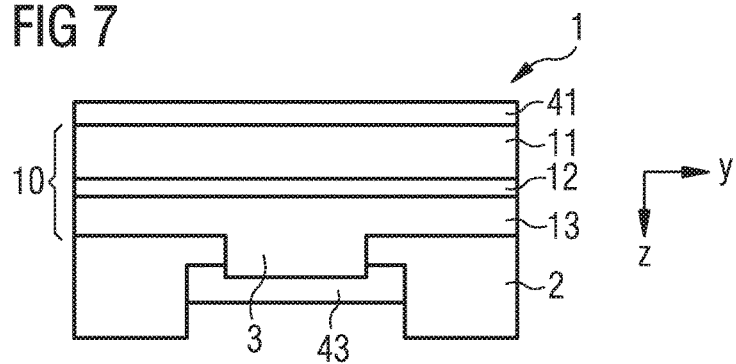

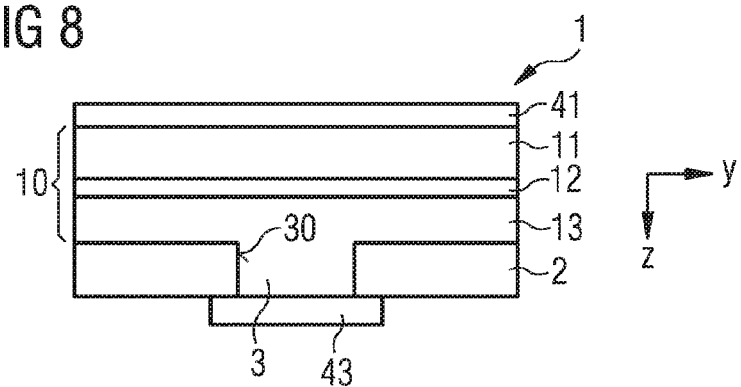
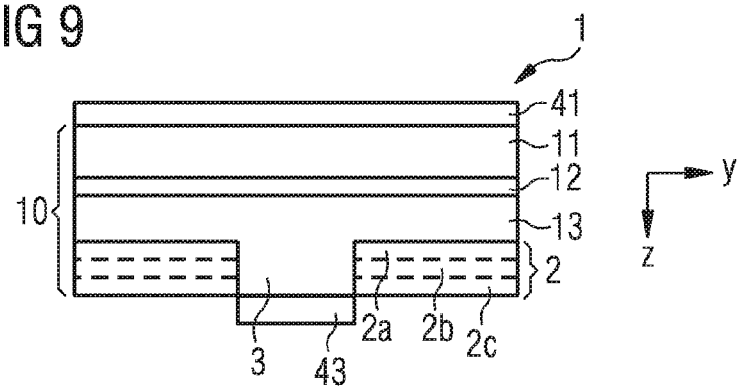
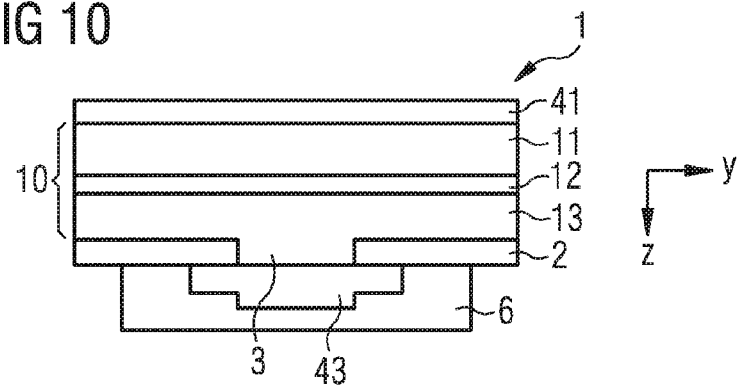
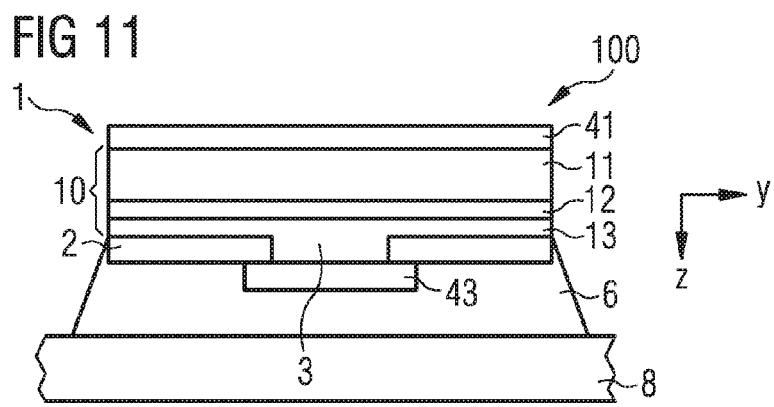

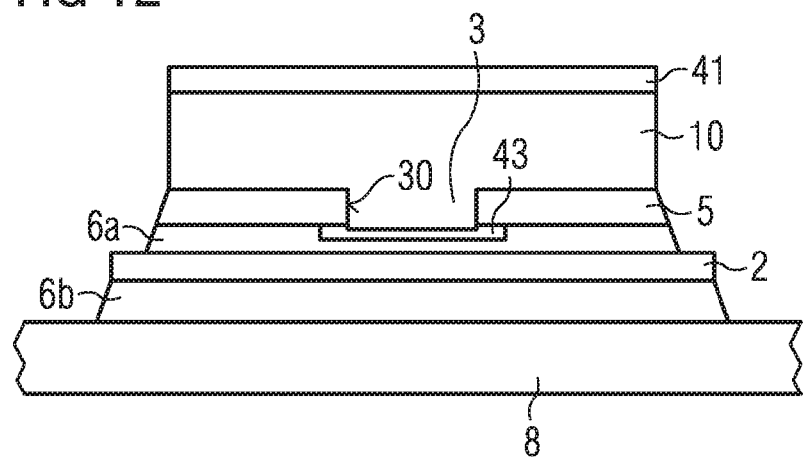
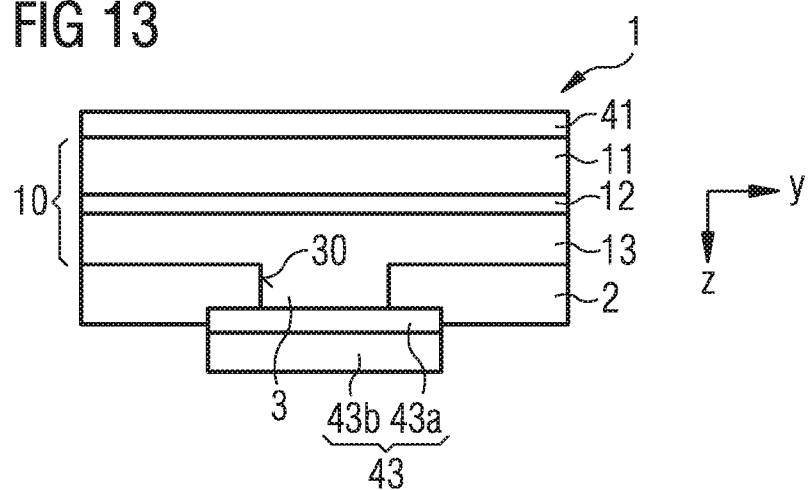
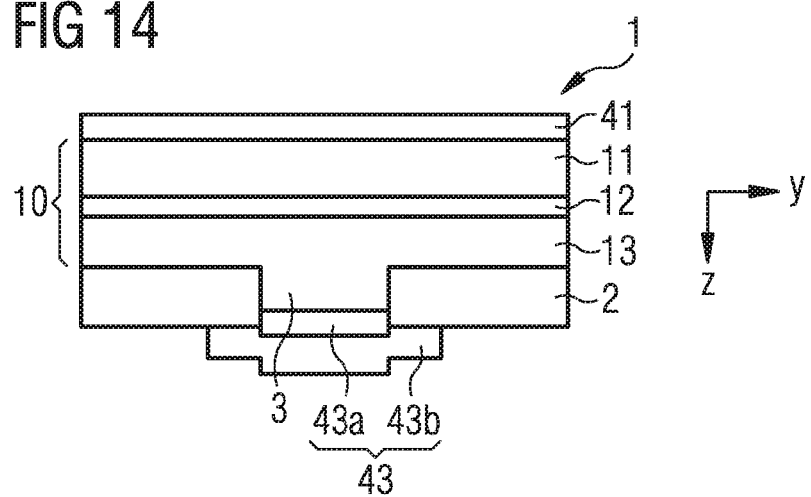

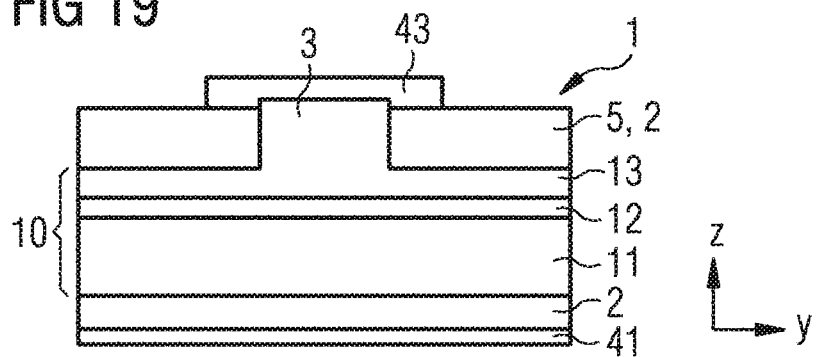
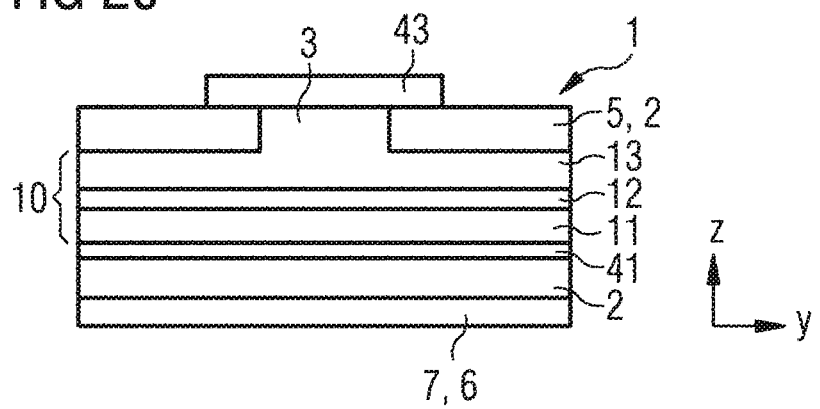
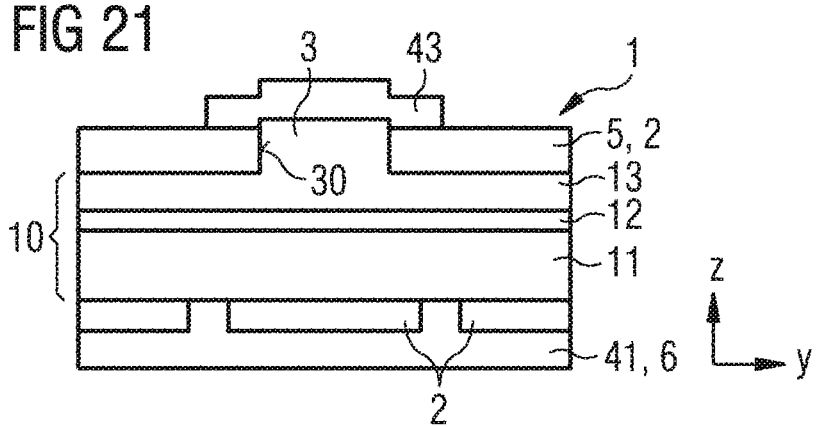

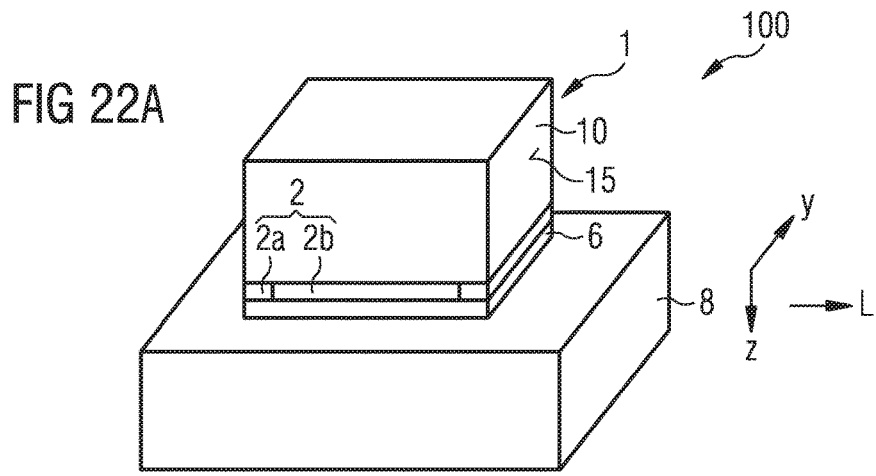
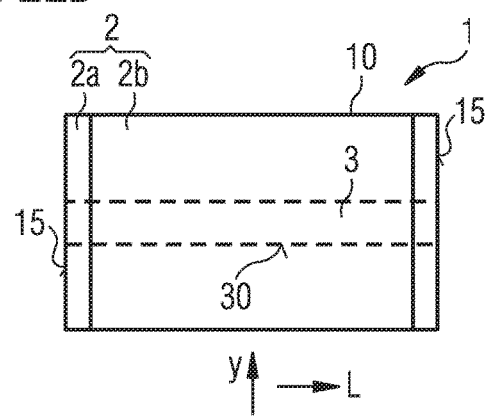
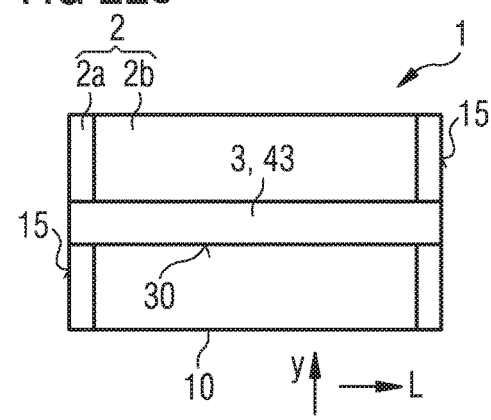
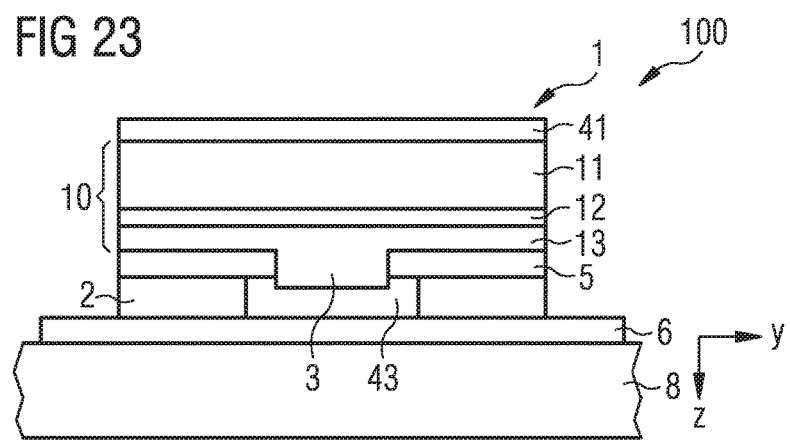

SEMICONDUCTOR STRIP LASER AND SEMICONDUCTOR COMPONENT

This patent application is a national phase filing under section 371 of PCT/EP2015/056083, filed Mar. 23, 2015, which claims the priority of German patent application 10 2014 105 191.2, filed Apr. 11, 2014, each of which is incorporated herein by reference in its entirety.

TECHNICAL FIELD

A semiconductor strip laser is provided. Furthermore, a semiconductor component having such a semiconductor strip laser is provided.

SUMMARY OF THE INVENTION

Embodiments provide a semiconductor strip laser having a heat spreader that is integrated into said strip laser.

According to at least one embodiment, the semiconductor strip laser emits laser radiation in proper use. Said radiation may be a pulsed laser radiation or a continuous wave laser radiation.

According to at least one embodiment, the semiconductor strip laser comprises at least one semiconductor body. The semiconductor body is preferably grown epitaxially. The semiconductor body may be a continuous, epitaxially grown semiconductor layer sequence.

The semiconductor body is preferably based upon a III-V-semiconductor compound material or a II-VI-semiconductor compound material. The semiconductor material may be a nitride semiconductor compound material such as $Al_nIn_{1-n-m}Ga_mN$ or a phosphide semiconductor compound material such as $Al_nIn_{1-n-m}Ga_mP$ or even an arsenide semiconductor compound material such as $Al_nIn_{1-n-m}Ga_mAs$, for example, where $0 \leq n \leq 1$, $0 \leq m \leq 1$ and $n+m \leq 1$. Here, the semiconductor body may comprise one or multiple dopants as well as additional components. However, for the sake of clarity, merely the essential components of the crystal lattice of the semiconductor body are indicated, namely Al, As, Ga, In, N or P, even if said components may be replaced and/or supplemented by small amounts of further substances.

According to at least one embodiment, the semiconductor body comprises a first semiconductor region of a first conductivity type. In particular, said first semiconductor region is an n-conductively doped region. The first semiconductor region may comprise one individual semiconductor layer or a plurality of semiconductor layers, for example a shell layer, a waveguide layer and/or electric contact layers.

According to at least one embodiment, the semiconductor body comprises a second semiconductor region. The second semiconductor region is of a different conductivity type than the first semiconductor region. Preferably, the second semiconductor region is p-conductively doped. Just like the first semiconductor region, the second semiconductor region may be formed of one or multiple semiconductor layers and include, for example, a shell layer, a waveguide layer and/or an electric contact layer.

According to at least one embodiment, the semiconductor body includes one or multiple active zones. The at least one active zone is set up for the generation of the laser radiation in proper use of the semiconductor strip laser. The active zone is located between the first and the second semiconductor region. The active zone may directly be adjacent to the first and the second semiconductor region. Preferably, the active zone and the semiconductor layers do not penetrate into one another. An boundary surface between the first and the second semiconductor region as well as the active zone may have a planar or smooth design.

According to at least one embodiment the semiconductor strip laser comprises a strip waveguide. Said strip waveguide is at least or exclusively formed of the material of the second semiconductor region. In particular, the strip waveguide is free of the active zone. As an alternative, the strip waveguide may entirely or partially include the active zone and comprise material of both semiconductor regions. In particular, the strip waveguide is formed by a material removal of the second semiconductor region, so that the strip waveguide then constitutes an elevation over remaining regions of the semiconductor strip laser.

According to at least one embodiment, the strip waveguide is set up for wave guidance, in particular a one-dimensional wave guidance, of the laser radiation generated during operation. Preferably, wave guidance is effected along exactly one direction in space. Then, the strip waveguide extends along said direction in space. Said direction in space is also referred to as waveguide direction. In particular, the strip waveguide extends in a straight line between two facets of the semiconductor body, which may be configured as a resonator mirror. In proper use, the semiconductor strip laser may be a mono-mode laser or a multi-mode laser due to the strip waveguide.

According to at least one embodiment, the semiconductor strip laser comprises a first electric contact on the first semiconductor region. Furthermore, the semiconductor strip laser comprises a second electric contact on the second semiconductor region. The first and the second electric contact are designed for current impression into the semiconductor body. A material of the first electric contact and of the second electric contact may in each case be different from a material of the semiconductor body. Preferably, the first and the second electric contact are designed to be resistively conductive. It is possible that the first and/or second electric contact is each formed of a transparent, electrically conductive oxide such as indium-tin-oxide or of one or multiple metals.

According to at least one embodiment, the semiconductor strip laser includes one or multiple heat spreaders. The at least one heat spreader is set up for heat dissipation and/or heat spreading in a direction away from a region of the active zone in that the laser radiation is being generated. In particular, the heat spreader is designed for a lateral heat spread. In this case, lateral means in the direction perpendicular to a growth direction of the semiconductor body.

According to at least one embodiment, the heat spreader has an average heat conductivity of at least 25 W/mK or 50 W/mK or 75 W/mK or 100 W/mK or 150 W/mK or 200 W/mK. It is possible that the entire heat spreader comprises the above heat conductivities continuously.

According to at least one embodiment, the heat spreader is connected to the semiconductor body in a dimensionally stable manner up to a temperature of 130° C. or 220° C. or 270° C. That is, melting or deforming of a region between the semiconductor body and the heat spreader will not be effected up to the stated temperature. In particular, there is no solder between the semiconductor body and the heat spreader so that the heat spreader is connected to the semiconductor body in a solder-free manner.

According to at least one embodiment, the heat spreader is attached to the semiconductor body without a joining agent. This may mean that only materials applied by chemical liquid deposition or chemical vapor deposition are located between the semiconductor body and the heat spreader. Just as well, it is possible that the heat spreader is directly applied to the semiconductor body. For example, the heat spreader and optionally all intermediate layers between the semiconductor body and the heat spreader are applied by evaporation, metalorganic vapor deposition, epitaxy, sputtering or galvanizing. In particular, neither the heat spreader nor a layer optionally arranged between the heat spreader and the semiconductor body is set up to be changed in its form in proper use or during proper installation.

In at least one embodiment, the semiconductor strip laser comprises a first semiconductor region of a first conductivity type of a semiconductor body. Further, the semiconductor strip laser includes a second semiconductor region of a different, second conductivity type of the semiconductor body. At least one active zone for generation of a laser radiation is located between the first and the second semiconductor regions. A strip waveguide is at least formed in the second semiconductor region. The strip waveguide is preferably set up for a one-dimensional wave guidance along a waveguide direction of a laser radiation generated in the active zone during operation. A first electric contact is located on the first semiconductor region and a second electric contact is located on the second semiconductor region. Furthermore, the semiconductor strip laser includes at least one heat spreader that is connected to the semiconductor body in a dimensionally stable manner up to a temperature of 220° C. The heat spreader has an average heat conductivity of at least 50 W/mk.

Inter alia, an optical power output of semiconductor components is reduced or limited by lost heat during operation. For example, in GaN-based semiconductor lasers, only 10% to 40% of an electric energy is transformed into light. The remaining energy is dissipated in heat and needs to be dissipated from the component. Heat dissipation of loss heat toward a heat sink is reduced by materials that are used for a required passivation of the components in conventional semiconductor lasers. Just as well, solder layers prevent efficient heat dissipation. In conventional semiconductor layers, passivation layers are usually formed of a silicon oxide and a heat spreader, for example of an aluminum nitride, is soldered to the semiconductor body.

In the semiconductor strip laser described herein, the heat spreader is directly applied to the chip particularly in place of a passivation so that a thermal barrier, e.g. by a solder layer, is dispensed with between the heat spreader and the semiconductor body. For example, in the case of an assembly via the side on that the strip waveguide is formed, it is possible to dissipate lost heat from the active zone not only via the in general well-conductive semiconductor material of the semiconductor body, but an efficient heat dissipation toward a heat sink is also possible via the heat spreader. Here, a heat stream is spread in the heat spreader already, which may result in a reduced thermal resistance in a solder boundary surface of the semiconductor strip laser toward a heat sink.

Due to the fact that the heat spreader is directly attached to the semiconductor strip laser and/or directly integrated in the semiconductor strip laser, a thermal barrier of a solder between the semiconductor strip laser and the heat spreader is omitted. In addition, fixing the semiconductor strip laser to the otherwise separate heat spreader is omitted in an assembly of the semiconductor strip laser. As a result, manufacturing tolerances in terms of positioning may be increased, leading to a cost reduction. Moreover, the risk of a solder between the semiconductor body and the heat spreader being undesirably molten when the semiconductor strip laser is later soldered to a heat sink is omitted. Then, a solder is only still required between the heat spreader, which is integrated in the semiconductor strip laser, and an external heat sink, so that a solder is more distant to a semiconductor material of the semiconductor body, whereby a risk of electric short-circuits can be further reduced during a mounting process.

According to at least embodiment, the heat spreader comprises one or more of the following materials or consists of one or more of the following materials: a carbide such as silicon carbide or boron carbide, a semiconductor material such as silicon or germanium, a nitride such as aluminum nitride or boron nitride or beryllium nitride, an oxide such as beryllium oxide, diamond-like carbon.

According to at least one embodiment, the heat spreader is attached on both sides of the strip waveguide, in a plan view of the strip waveguide viewed along a direction parallel to a growth direction of the semiconductor body. This does not exclude that the strip waveguide is additionally covered by the heat spreader partially or entirely.

According to at least one embodiment, the heat spreader contacts the strip waveguide at least in places. For example, the heat spreader contacts at least or only side surfaces of the strip waveguide. The side surfaces of the strip waveguides may be completely covered by a material of the heat spreader. Just as well, the heat spreader may contact a side of the strip waveguide facing away from the active zone at least in places or entirely.

According to at least one embodiment, the heat spreader extends completely along the strip waveguide along the waveguide direction. A length of the heat spreader is equal to or greater than a length of the strip waveguide, in particular along the waveguide direction.

According to at least one embodiment, the heat spreader has a width, in the direction perpendicular to the strip waveguide and in the direction perpendicular to a growth direction of the semiconductor layer sequence, said width being at least 30 μm or 50 μm or 100 μm or 150 μm. As an alternative or in addition, said width is 500 μm or 300 μm or 200 μm as a maximum.

According to at least one embodiment, the second electric contact covers the heat spreader in places or entirely, viewed in a plan view of the strip waveguide. It is possible that the second electric contact contacts or touches the heat spreader all over or in places.

According to at least one embodiment, the second electric contact is made of one or more of the material stated in the following or comprises one or more of said materials: silver, gold, chromium, nickel, palladium, platinum, titanium.

According to at least one embodiment, the strip waveguide protrudes from the heat spreader in the direction away from the active zone and/or in the direction parallel to a growth direction of the semiconductor body.

According to at least one embodiment, the semiconductor strip laser includes at least one passivation layer. Said passivation layer is set up for protection of the semiconductor strip laser, in particular for protection of the semiconductor body. Preferably, the passivation layer is designed to be electrically insulating. Furthermore, the passivation layer preferably is impermeable to gas, especially to air oxygen and air vapor.

According to at least one embodiment, the passivation layer is in direct contact to the second semiconductor region and to the heat spreader. It is possible that the passivation layer exclusively contacts the heat spreader and the second semiconductor region. Further, it is possible that the passivation layer is completely or partially located between the second semiconductor region and the heat spreader.

According to at least one embodiment, the passivation layer has a thickness of 50 nm or 100 nm or 200 nm or 400 nm as a maximum. As an alternative or in addition, the thickness of the passivation layer is at least 10 nm or 20 nm.

According to at least one embodiment, the passivation layer is formed of an oxide such as $Al_2O_3$ or $SiO_2$ or even of a nitride such as $Si_3N_4$.

According to at least one embodiment, side surfaces of the strip waveguide are free from the passivation layer. In this case, the side surfaces are preferably covered by the heat spreader at least in places.

According to at least one embodiment, the heat spreader terminates flush with the strip waveguide and/or the second electric contact in the direction away from the active zone and/or in the direction parallel to a growth direction. As an alternative, it is possible for the heat spreader to protrude from the second electric contact along said direction.

According to at least one embodiment, the second electric contact covers the strip waveguide all over, viewed in a plan view. In other words, the strip waveguide may be located completely between the second electric contact and the active zone.

According to at least one embodiment, the heat spreader comprises one or multiple sublayers that are formed of a semiconductor material. It is possible that the heat spreader consists of one or more semiconductor materials. In particular, the heat spreader is in direct contact to the second semiconductor region, which may be p-doped.

According to at least one embodiment, the semiconductor material of the heat spreader is un-doped, i.e. intrinsically conductive, or doped. In the case of a doped semiconductor material or at least a doped layer, the heat spreader is preferably doped inverse to a material of the second semiconductor region. In particular, a pn-junction may be realized in the heat spreader and/or on a boundary surface to the second semiconductor material, in particular in the reverse direction in proper use of the semiconductor strip laser.

According to at least one embodiment, the semiconductor strip laser comprises one or multiple solder layers. The at least one solder layer is formed of a solder, preferably of a soft solder such as a gold-tin of a silver-tin solder. The solder layer or at least one of the solder layers is preferably in direct physical contact with the second electric contact and optionally with the head spreader as well.

According to at least one embodiment, the solder layer or at least one of the solder layers entirely covers the second electric contact, viewed in a plan view and along a direction parallel to a growth direction of the semiconductor layer sequence. Here, it is possible for the solder layer to have a smaller lateral extension, the same lateral extension or a greater extension than the semiconductor body.

According to at least one embodiment, the heat spreader comprises two or more than two sub-regions. Said sub-regions are particularly formed of different materials or material compositions, for example of different metals or of different nitrides.

According to at least one embodiment, the sub-regions of the heat spreader follow one another directly or indirectly in a direction away from the active zone, i.e. in the direction parallel to a growth direction of the semiconductor body, and/or in the lateral direction away from the strip waveguide and/or along the waveguide direction. The sub-regions of the heat spreader have a continuous design, at least on one side of the strip waveguide.

According to at least one embodiment, at least one of the sub-regions of the heat spreader has an average distance of at least 25 μm or 50 μm or 100 μm to a facet of the semiconductor body. The corresponding sub-region may be directly adjacent to the facet and/or form part of the facet.

According to at least one embodiment, the facet is a light exit surface of the semiconductor body and/or of the semiconductor strip laser. The facet is particularly formed as a resonator mirror of the semiconductor strip laser. It is possible that the facet is perpendicularly oriented to the waveguide direction of the strip waveguide.

According to at least one embodiment, the heat spreader or one of the heat spreaders is arranged on the first semiconductor region. Said heat spreader may contact the first semiconductor region. In particular, said heat spreader is arranged at a distance to the strip waveguide then, wherein there is no need for the heat spreader to contact the second semiconductor region.

According to at least one embodiment, the heat spreader has at least one opening. Said at least one opening preferably entirely penetrates through the heat spreader. The semiconductor body is electrically contacted by means of an electric connection means through said at least one opening. The electric connection means, in particular a solder or a metallization, may be electrically conductively connected through the heat spreader to the first and/or second electric contact or even to the first semiconductor region and/or the second semiconductor region.

According to at least one embodiment, a metal layer is located between the heat spreader or one of the heat spreader and the semiconductor body. For example, such a metal layer is located between the first semiconductor material and the heat spreader and may contact said two components, respectively. Preferably, said metal layer is not a solder.

According to at least one embodiment, the first and/or the second electric contact comprises at least two sublayers. Preferably, all sublayers have a resistively conducting design. The sublayers may directly follow one another in the direction away from the strip waveguide along a lateral direction on in the direction parallel to a growth direction of the semiconductor layer sequence.

According to at least one embodiment, the sublayer of the first and/or of the second electric contact located closer to the strip waveguide is formed of a semiconductor material of a transparent, conductive oxide. For example, said sublayer consists of one or more of the materials named in the following of comprises one or more of said materials: Zinc oxide, indium tin oxide, ITO for short, aluminum nitride, gallium nitride, indium nitride, AlGaN, InGaN, AlInGaN. As an alternative or in addition, a sublayer of the first and/or second electric contact located more far away from the strip waveguide comprises one or more of the following materials or consists of one or more of said materials: aluminum, gold, chromium, nickel, palladium, platinum, titanium.

Furthermore, a semiconductor component is provided. The semiconductor component comprises one or more of the semiconductor strip lasers, as indicated in conjunction with one or more of the above-mentioned embodiments. Features of the semiconductor component are thus also disclosed for the semiconductor strip laser and vice versa.

In at least one embodiment, the semiconductor component comprises a carrier. The at least one semiconductor strip laser is fastened to the carrier, preferably soldered by means of a solder layer. Further, said carrier is a heat sink. Furthermore, the carrier may comprise electric conductor paths and electric connection elements for electrically operating the semiconductor strip laser.

According to at least one embodiment, the heat spreader is located between the semiconductor body of the semiconductor strip laser and the solder layer. In particular, the solder layer is limited to such a region so that a region between the heat spreader and the semiconductor body remains free from a solder.

According to at least one embodiment, the heat spreader and the solder layer contact one another. In particular, the semiconductor strip laser is fixed over the heat spreader and the solder layer on the carrier so that the solder layer contacts the heat spreader and the carrier. It is possible that the solder layer exclusively contacts the carrier and the heat spreader.

BRIEF DESCRIPTION OF THE DRAWINGS

Hereinafter, a semiconductor strip laser described herein and a semiconductor component described herein are explained in further detail with reference to the drawings in conjunction with exemplary embodiments. Like reference numerals relate to like elements in the individual figures. However, said drawings are not to scale, the individual elements can rather be illustrated in an exaggerated large manner for a better understanding.

The figures show in:

FIGS. 1, 3 to 10 and 13 to 21 schematic sectional illustrations of exemplary embodiments of semiconductor strip lasers described herein, FIGS. 2 and 12 schematic sectional illustrations of modifications of semiconductor strip lasers or semiconductor components described herein, FIGS. 11 and 23 schematic sectional illustrations of exemplary embodiments of semiconductor components described herein with semiconductor strip lasers described herein, FIG. 22 a perspective illustration as well as plan views of an exemplary embodiment of a semiconductor component described herein with a semiconductor strip laser described herein, and FIG. 24 a schematic illustration of heat conductivities plotted against expansion coefficients of various materials.

DETAILED DESCRIPTION OF ILLUSTRATIVE EMBODIMENTS

Figure 15:
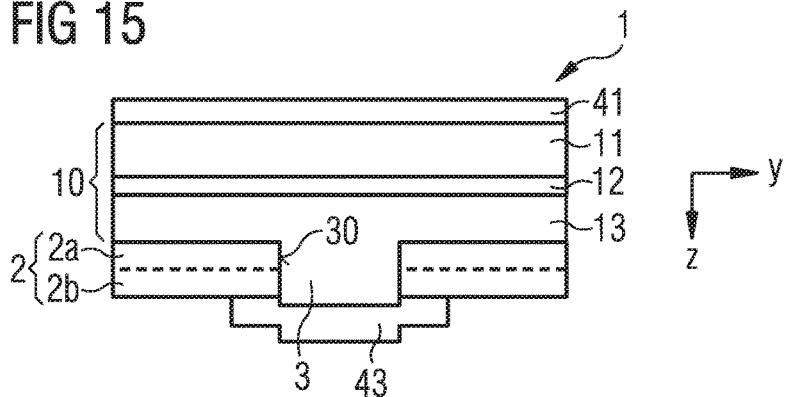

FIG. 1 shows an exemplary embodiment of a semiconductor strip laser 1. The semiconductor strip laser 1 comprises a semiconductor body 10. A first n-doped semiconductor region 11, an active zone 12 as well as a second p-doped semiconductor region 13 follow directly one after the other along a growth direction z. A strip waveguide 3 extends in the direction perpendicular to the drawing plane of FIG. 1. A waveguide direction L of laser radiation in the semiconductor strip laser us also oriented perpendicular to the drawing plane of FIG. 1.

For example, the strip waveguide 3 is formed from the second semiconductor region 13 by etching. Along the growth direction z, the strip waveguide 3 has an extension of at least 100 nm or 600 nm and/or at least 5 µm or 3 µm or 1.5 µm. A width of the strip waveguide 3 along a lateral direction y in the direction perpendicular to the growth direction z is at least 1 µm or 1.5 µm and, alternatively or additionally, at most 100 µm or 50 µm or 15 µm. Side surfaces 30 of the strip waveguide 3 can be oriented parallel or almost parallel to the growth direction z. The indicated values may also apply to all of the other exemplary embodiments.

Further, the strip waveguide 1 comprises a heat spreader 2. The heat spreader 2 is preferably formed of a highly heat-conductive material and firmly integrated in the semiconductor strip laser 1. Further, the heat spreader 2 preferably comprises a low current conductivity and a low absorption capacity with regard to a laser radiation generation during operation in the semiconductor strip laser. For example, the heat spreader 2 is of silicon carbide, of a diamond-like carbon, DLC for short, of GaN, of AlN or of AlGaN and preferably comprises a heat conductivity of at least 100 W/mK. The heat spreader 2 particularly ensures a heat distribution along the lateral direction y.

Further, the semiconductor strip laser 1 includes a first electric contact 41 on the first semiconductor region 11 as well as a second electric contact 43 on the second semiconductor region 13. The electric contacts 41, 43 are preferably resistively conducting regions. For example, the first and/or the second electric contact 41, 43 are formed by one or multiple metal layers and/or by one or multiple layers of a transparent conductive oxide. The first and second electric contacts 41, 43 preferably have a high heat conductivity and a high current conductivity. It is not required for the contacts 41, 43 to have a high reflectivity and/or a low absorptivity with respect to the laser radiation generated during operation of the semiconductor strip laser 1.

The second electric contact 43 preferably has a constant thickness along the lateral direction y. As a result, a step may be formed in the second electric contact 43. Said step is located along the growth direction z in extension of the side surfaces 30 of the strip waveguide 3.

The heat spreader 2 comprises, just like preferably in all exemplary embodiments, an electric resistance of at least $10^{-2}$ Ωcm or at least 1 Ωcm. This is particularly also true if the heat spreader 2 is formed of semiconductor layers that are un-doped. In the case that the heat spreader is formed of semiconductor layers that are doped, a p-n-junction toward the semiconductor body 10 may be realized. An absorption capacity of the heat spreader 2 with regard to the radiation generated in the semiconductor strip laser 1 is preferably at least at 5000 1/cm.

Furthermore, an effective refraction index of the heat spreader 2 is preferably smaller than an effective refraction index of the active zone 12. For example, the refractive index or the effective refractive index of the heat spreader 2 is at least at 2.5 or 2.6 in the case of a GaN-based semiconductor strip laser 1.

FIG. 2 shows a conventional strip laser. The strip waveguide 3 is limited in the lateral direction from a passivation layer 5. The passivation layer 5 has a comparatively great thickness and comes approximately up to a side of the strip waveguide 3 opposite the first electric contact 41. The passivation layer 5 is formed of a dielectric material such as aluminum oxide, silicon oxide or silicon nitride. As a result, the passivation layer 5 has a relatively poor heat conductivity. As a result, the passivation layer 5 prevents or reduces a lateral heat spread. This involves a poorer heat dissipation of the strip laser when mounting is effected on a heat sink over the second electric contact 43.

In the exemplary embodiment, as illustrated in FIG. 3, the passivation layer 5 is applied between the semiconductor body 10 and the heat spreader 2. It is possible for the passivation layer 5 to terminate flush with a side of the strip waveguide 3 facing away from the active zone 12 in the z-direction away from the active zone 12. Just like in all of the other exemplary embodiments it is possible for the second electric contact 43 to protrude from the strip waveguide 3 in the lateral direction y on both sides. In the exemplary embodiment according to FIG. 3, it is possible that the heat spreader 2 is formed of a thermally well conductive material such as silver.

In the exemplary embodiment according to FIG. 4, the passivation layer 5 covers the side surfaces 30 of the strip waveguide 3 as well as remaining regions of the second semiconductor region 13. Here, the passivation layer 5 preferably has a very thin design. For example, a thickness of the passivation layer 5 is at most 100 nm or 50 nm or 10 nm. The passivation layer 5 is applied by means of atomic layer deposition, ALD for short, for example. Just as well, the passivation layer 5 may be a crystalline layer.

Such a thin passivation layer 5 does not present a significant thermal resistance. This results in an efficient heat spreading by the heat spreader 2 in the lateral direction y. Just like in all other exemplary embodiments, it is possible that the strip waveguide 3, the second electric contact 43, the first electric contact 41 and/or the heat spreader 2 are formed symmetrically to a plane perpendicular to the drawing plane and parallel to the growth direction z.

The heat spreader 2 may terminate flush with the second electric contact 43 in the direction parallel to the growth direction z, in the direction z away from the active zone 12.

In the exemplary embodiment according to FIG. 5, the passivation layer 5 is restricted to a side of the second semiconductor region 13 facing away from the active zone 12. The side surfaces 30 of the strip waveguide 3 are thus not covered by the passivation layer 5.

Just like in all other exemplary embodiments, it is possible that the strip waveguide 3 protrudes into the second electric contact 43, in contrast to what is shown in conjunction with FIG. 4, according to which the second electric contact 43 terminates flush with the strip waveguide 3, parallel to the growth direction z. That is, the side surfaces 30 according to FIG. 5 are partially covered by a material of the second electric contact 43.

In the exemplary embodiment according to FIG. 6, the passivation layer 5 does not come up to the side surfaces 30 of the strip waveguide 3. A distance between the passivation layer 5 and the side surfaces 30 preferably is at most 100 μm or 10 μm or 1 μm. In this case, the passivation layer 5 serves particularly for insulating the edges of a chip. In contrast to what is shown the passivation layer 5 may extend on side surfaces of the semiconductor body 10. Such a passivation layer 5 may ensure an efficient heat dissipation from the region of the strip waveguide 3 in all directions.

In the exemplary embodiment according to FIG. 7, the heat spreader 2 partially or entirely adjoins an upper edge of the second electric contact 43 facing away from the active zone 12. The heat spreader 2 may protrude from the second electric contact 43 along the growth direction z. It is possible for the heat spreader 2 to be acting as a solder stop region, just like in all of the other exemplary embodiment.

According to FIG. 8, the heat spreader 2 is formed of an un-doped semiconductor material. Thus, the heat spreader 2 may be based upon the same semiconductor material as the semiconductor body 10. However, the heat spreader 2 is preferably different from the doping of the second semiconductor region 13.

In the case that the heat spreader 2 is doped, a doping of the heat spreader 2 is preferably reverse to a doping of the second semiconductor region 13. For example, if the second semiconductor region 13 is p-doped, the heat spreader 2 is n-doped.

A current impression into the semiconductor body 10 by the heat spreader 2 can thus be prevented or reduced. A current supply via the second electric contact 43 is thus predominantly effected only through the strip waveguide 3.

Just like in all of the other exemplary embodiments, it is possible for the first electric contact 41 to extend over an entire side of the first semiconductor region 11 facing away from the active zone 12.

In the exemplary embodiment according to FIG. 9, the heat spreader 2 is composed of multiple subregions 2a, 2b, 2c. The subregions 2a, 2b, 2c follow directly one behind the other along the growth direction z and may extend all the way to a side of the strip waveguide 3 facing away from the active zone 12. The subregions 2a, 2b, 2c may have different thicknesses or the same thickness.

The subregions 2a, 2b, 2c, which are each designed as layers, are preferably doped in an alternating manner. The subregion 2a located closest to the second semiconductor region 13 preferably has a doping reverse to the second semiconductor region 13. In the case that the second semiconductor region 13 is p-doped, for example, the subregions 2a, 2c are each n-doped and the subregion 2b is p-doped. This achieves at least a p-n-junction in the reverse direction in the heat spreader 2 so that a current supply is restricted to the strip waveguide 3. One of the subregions 2a, 2b, 2c may already be sufficient for the reverse effect, see also FIG. 8, so that two of the subregions 2a, 2b, 2c are optional.

Optionally it is possible that a protective diode for protection against electrostatic discharge is realized by means of the heat spreader 2, if the latter is particularly based upon semiconductor materials, and by a suitable electric circuitry.

In the exemplary embodiment according to FIG. 10, the semiconductor strip laser 1 additionally comprises a solder layer 6. The solder layer 6 is preferably attached to the second electric contact 43 and optionally extends in the lateral direction y also to the heat spreader 2. The solder layer 6 is preferably narrower along the lateral direction y than an extension of the semiconductor body 10 and/or of the semiconductor strip laser 1. However, by a later soldering process, the solder layer 6 may flow along the lateral direction y and become wider.

FIG. 11 shows an exemplary embodiment of a semiconductor component 100 with a semiconductor strip laser 1 and with a carrier 8. The carrier 8 preferably acts as a heat sink for the semiconductor strip laser 1. Just as well, an electric contacting of the semiconductor strip laser 1 can be achieved via the carrier 8.

The semiconductor strip laser 1 according to FIG. 11 is structured, for example, as described in conjunction with FIG. 10. In this case, just like may be the case in all of the other exemplary embodiments, the heat spreader 2 and the semiconductor body 10 have the same width or said semiconductor body 10 has a greater width than the heat spreader 2, along the lateral direction y.

A thickness of the heat spreader 2 along the growth direction 2 is preferably at most 5 μm. After being molten thereon, the solder layer 6 has preferably the same width as the semiconductor body 10 and/or the semiconductor strip laser 1, see FIG. 10. As an alternative, it is possible that the solder layer 6 protrudes from the semiconductor body 10 and/or the semiconductor strip laser 1 by no more than 200 μm or 100 μm along the lateral direction y. As an alternative, the semiconductor body 10 and/or the semiconductor strip laser 1 may project from the solder layer 6 in the lateral direction y, for example by 50 μm or 100 μm maximum.

Lateral boundary surfaces of the solder layer 6 may be oriented obliquely to the growth direction z. Furthermore, it is optionally possible that the solder layer 6 extends to lateral boundary surfaces of the heat spreader 2.

Just like in all of the other exemplary embodiments that a passivation layer is not explicitly shown in it is possible in conjunction with FIG. 11 that such a passivation layer is present, in particular as illustrated in conjunction with the exemplary embodiments according to the FIGS. 3 to 6.

FIG. 12 shows a modification of a semiconductor component. According to FIG. 12, the strip laser comprises two solder layers 6a, 6b. By means of the first solder layer 6a, the heat spreader 2, which is formed of aluminum nitride, silicon carbide, boron nitride, gallium nitride or diamond-like carbon, for example, is soldered to remaining parts of the semiconductor strip laser 1. A thickness of the heat spreader 2 is between 10 μm and 1000 μm. Then, the heat spreader 2 is soldered to the carrier 8 with the second solder layer 6b. As a result, in contrast to the exemplary embodiment according to FIG. 11, a solder layer 6a is located between the heat spreader 2 and the semiconductor body 10, said solder layer presenting an additional thermal resistance. In particular, an efficient, lateral heat spread is not realized by the passivation layer 5 close to the strip waveguide 3.

Thus, in the strip laser according to FIG. 12, two soldering processes are to be performed, which is why a mounting process and a manufacturing process of the component according to FIG. 12 are more elaborate than in the semiconductor component 100 illustrated in conjunction with FIG. 11. Further, in order to prevent a melting of the first solder layer 6a when processing the second solder layer 6b, the solders need to have different compositions. An overall heat resistance is also increased by the two solder layers 6a, 6b. Further, there is a risk that particularly material of the solder layer 6a migrates over an edge of the chip, resulting in short circuits. In particular when being mounted over the second electric contact 43, which may represent a p-metallization, the active zone 12 has a distance of only about 1 μm or less to the first solder layer 6a.

In contrast, the exemplary embodiment of the semiconductor component 100, as illustrated in FIG. 11, allows for a simplified process with one soldering process only. A lower total solder thickness achieves an improved heat resistance, thus by means of the heat spreader reducing a risk of short circuits due to solder migration, due to the smaller width of the solder layer 6 and due to the increased distance of the solder layer 6 to the active zone 12.

FIG. 13 shows another exemplary embodiment. According to FIG. 13, the second electric contact 43 is composed of two sublayers 43a, 43b. The first sublayer 43a located closer to the active zone 12 preferably comprises a lower absorption for the laser generation generated during operation of the semiconductor strip laser 1 than the second sublayer 43b located farther away from the active zone 12. For example, the first sublayer is formed of ZnO, ITO, AlN, GaN, InN, AlGaN, InGaN or AlInGaN. For example, the second sublayer 43b is formed of Ti, Cr, Zr, Pt, Ni, Pd, Au or Al as well as combination hereof. Here, the heat spreader 2 may extend along the growth direction z all away into the first sublayer 43a or, in contrast to what is illustrated, even all the way to the second sublayer 43b.

As shown in FIG. 14, it is also possible for the sublayers 43a, 43b to have different expansions along the lateral direction y. For example, the first sublayer 43a located closer to the active zone 12 is restricted to the strip waveguide 3 along the lateral direction y. The second sublayer 43b projects from the strip waveguide 3 along the lateral direction y and even extends to the heat spreader 2.

Second electric contacts 43 formed this way may also be present in all of the other exemplary embodiments. Just as well, it is possible for the first electric contact 41 to comprise multiple of the sublayers.

In the exemplary embodiment according to FIG. 15, the heat spreader 2 has a multilayer design. The layer-type subregions 2a, 2b follow directly one behind the other along the growth direction z.

For example, the first subregion 2a, located directly on the second semiconductor region 13, is optimized with respect to a thermal conductivity and with respect to an optimum heat out-coupling from the semiconductor body 10. For example, the second subregion 2b is optimized in terms of the thermal expansion coefficient, in order to allow for reduced tensions or no tensions at all in the semiconductor body 10. The subregions 2a, 2b may be different in terms of their mechanical strength, electric conductivity, thermal expansion coefficient and in other properties just as well.

Figure 16:
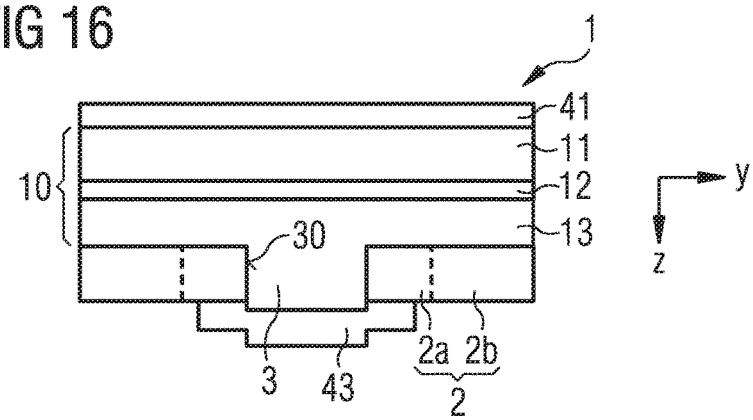

According to FIG. 16, the subregions 2a, 2b are arranged along the lateral direction y one behind the other. For example, the first subregion 2a located directly on the strip waveguide 3 has an electrically insulating design and the second subregion 2b is formed of a metal.

Figure 17:
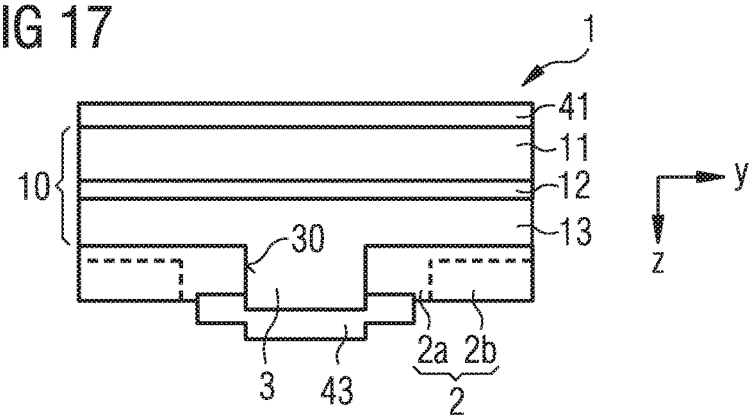

According to FIG. 17, the subregions 2a, 2b follow one behind the other both along the growth direction z and the lateral direction y. The first subregion 2a located closer to the active zone 12 has an L-shaped design, viewed in the cross-section. The first-subregion 2a has an electrically insulating design, for example. The second subregion 2b may have a metallic design and/or an electrically conductive design.

Figure 18:
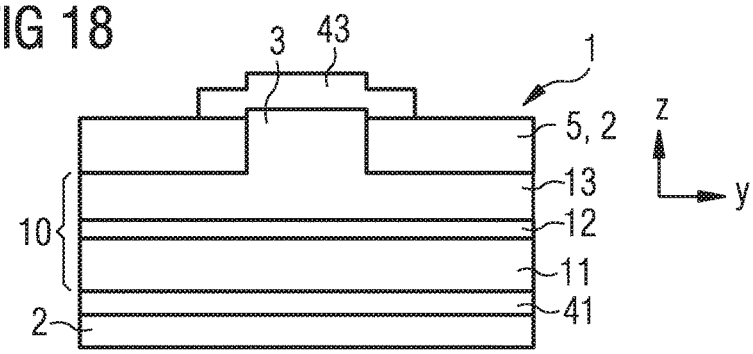

FIG. 18 shows that the heat spreader 2 is attached as a layer to a side of the first electric contact 41 facing away from the semiconductor body 10. Here, the heat spreader preferably has the same width as the semiconductor body 10 and/or the semiconductor strip laser 1, preferably with a tolerance of at most 100 μm or 50 μm or 20 μm. Preferably, the heat spreader 2 is produced to be electrically conductive, for example of a metal or a metal alloy.

In the exemplary embodiment according to FIG. 19, the heat spreader 2 is directly located on the semiconductor body 10. Thus, the heat spreader 2 is located between the first electric contact 41 and the first semiconductor region 11. Thus, a solder is not present between the heat spreader 2 and the semiconductor body 10, just like in the all of the other exemplary embodiments. Also, the heat spreader 2 is of electrically-conductive design also in this exemplary embodiment.

The exemplary embodiment according to FIG. 20 corresponds to the exemplary embodiment according to FIG. 18, wherein a further metal layer 7 and/or solder layer 6 is attached to the side of the heat spreader 2 facing away from the active zone 12. Said solder layer 6 enables an electric and/or mechanical and/or thermal contacting of the semiconductor strip laser 2 to an external carrier (not illustrated).

According to FIG. 21, multiple openings are formed into the heat spreader 2, said openings completely penetrating the heat spreader 2 along the growth direction z. The first electric contact 41, which may be designed as a solder layer 6, realizes an electric contact toward the semiconductor body 10. Here, the heat spreader 2 may have an electrically conductive design or an electrically insulating design.

Such heat spreaders 2 on the first semiconductor region 11, as shown in conjunction with the FIGS. 18 to 21, can additionally be formed into heat spreaders 2 on the second semiconductor region 13. As a result, the heat spreaders 2 of FIGS. 18 to 21 can be combined with heat spreaders 2, for example of FIGS. 3 to 10.

FIG. 22 shows another exemplary embodiment of the semiconductor component 100, see the perspective illustration in FIG. 22A and the schematic plan views in the FIGS. 22B and 22C.

The strip waveguide 3 extends preferably entirely along a waveguide direction L, just like in all of the other exemplary embodiments. It is possible that the electric contacts 41, 43 not illustrated in FIG. 22 also extend entirely along the strip waveguide 3 or are restricted to certain regions. In particular, regions close to the facets 15 are free from electric contacts 41, 43.

For example, an electrically insulating heat spreader 2a may be attached close to the facets in order to suppress a current supply of the facets 15. An electrically conductive sub-region 2b of the heat spreader 2 is present in the remaining regions, see FIGS. 22B and 22C. It is possible, in contrast to what is illustrated, that sub-region 2b covers the electrically non-conductive sub-region 2a in regions close to the facets. In contrast to what is shown, it is possible that the electrically insulating sub-region 2a is restricted to one of the facets 15 only. The subregions 2a, 2b may optionally also cover the strip waveguide 3 or be attached along the lateral direction y in each case only laterally next to the strip waveguide 3. In this context, the term "close to the facets" may relate to a region that has a distance to the facets 15 of at most 100 µm or 50 µm or 20 µm.

In the semiconductor component 100 as illustrated in FIG. 23, a semiconductor strip laser 1 as illustrated in conjunction with FIG. 3 is soldered to the carrier 8 on top of the solder layer 6.

A thickness of the first and/or second metallization 41, 43 is preferably at least 50 nm or 100 nm. Alternatively or additionally, said thickness along the growth direction z is at most 5 µm or 10 µm. The semiconductor body 10 preferably has a thickness of at least 20 µm or 50 µm and/or of at most 200 µm or 1000 µm along the growth direction z. A passivation layer 5 preferably has a thickness of at most 30 µm or 2000 µm. A thickness of the heat spreader 2 preferably is at least 10 nm or 100 nm and/or at least 5 µm or 500 µm. The solder layer 6 preferably has a thickness of at least 10 µm. A thickness of the carrier 8 designed as a heat sink is preferably at most 10 cm.

The semiconductor body 10 is preferably based upon AlGaInN, AlGaAsP, InGaAsP or ZnSe. The semiconductor body 10 may in each case comprise a growth substrate, in each case not illustrated. For example, the passivation is formed of a silicon oxide, a silicon nitride or a zirconium oxide. The heat spreader is based upon or comprises or consists of silicon carbide, diamond-like carbon, aluminum nitride, gallium nitride, boron nitride or boron carbide, for example. The solder layer 6 preferably comprises gold, tin, indium, nickel and/or silver. One part, in particular a main component, of the carrier 8 as a heat sink is copper. The stated dimensions and materials for the individual layers in this paragraph and in the preceding paragraph preferably, individually or in a combination, apply to all exemplary embodiments.

Figure 24:
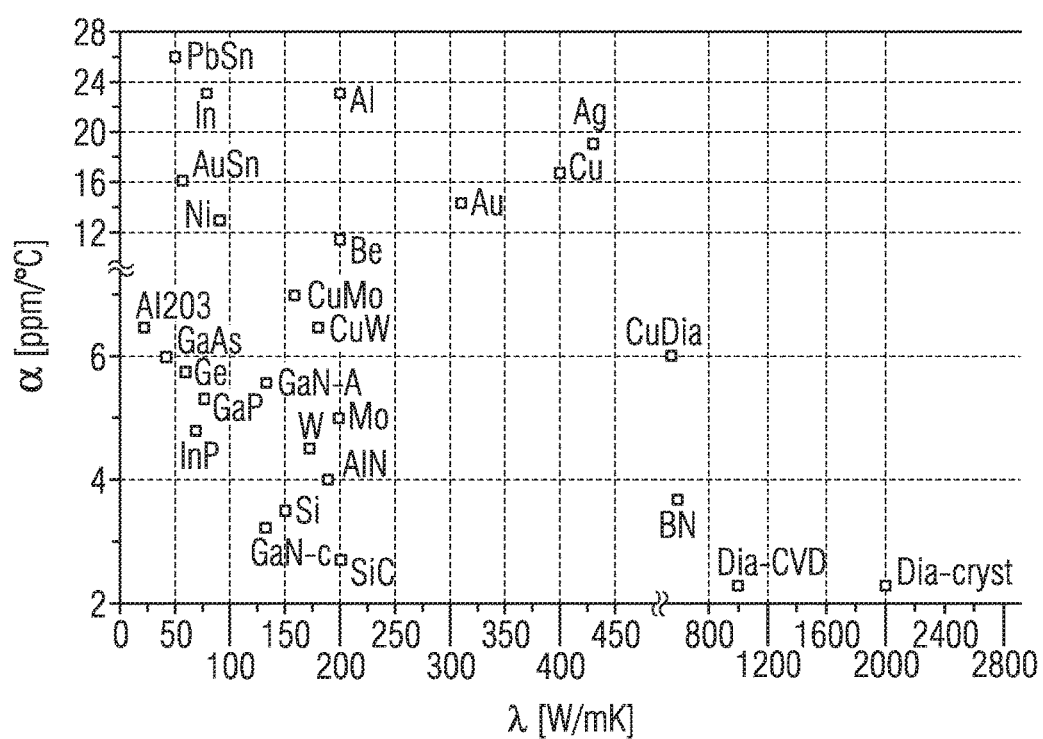

FIG. 24 illustrates the thermal conductivities X of different materials plotted against the thermal expansion coefficients α thereof. Depending on a material used for the semiconductor body 10, correspondingly adjusted materials are to be selected, especially if the heat spreader 2 comprises multiple subregions.

The invention described herein is not limited by the description in conjunction with the exemplary embodiments. The invention rather comprises any new feature as well as any combination of features, particularly including any combination of features in the patent claims, even if said feature or said combination of features is not explicitly indicated in the patent claims or exemplary embodiments.

The invention claimed is:

1. A semiconductor strip laser comprising:
   a first semiconductor region of a first conductivity type of a semiconductor body;
   a second semiconductor region of a second different conductivity type of the semiconductor body;
   at least one active zone of the semiconductor body configured to generate a laser radiation between the first and second semiconductor regions;
   a strip waveguide formed at least in the second semiconductor region and providing a one-dimensional wave guidance along a waveguide direction of the laser radiation generated in the active zone during operation;
   a first electric contact on the first semiconductor region;
   a second electric contact on the second semiconductor region; and
   at least one heat spreader dimensionally stably connected to the semiconductor body at least up to a temperature of 220° C., and having an average thermal conductivity of at least 50 W/m·K,
   wherein at least one of the at least one heat spreader is located on the first semiconductor region and arranged at a distance to the strip waveguide,
   wherein the at least one heat spreader comprises at least one opening on the first semiconductor region, the first semiconductor region being electrically contacted through the at least one opening, and
   wherein the at least one heat spreader comprises at least one of the following materials: SiC, Si, AlN, BN, BC, BeN, BeO, or diamond-like carbon.

2. The semiconductor strip laser according to claim 1, wherein the at least one heat spreader is connected to the semiconductor body in a solder-free manner so that no solder is located between the at least one heat spreader and the semiconductor body, and wherein the strip waveguide is formed in the semiconductor body exclusively in the second semiconductor region.

3. The semiconductor strip laser according to claim 1, further comprising at least one passivation layer and a further heat spreader, wherein the passivation layer is in direct contact with the second semiconductor region and the further heat spreader, wherein the passivation layer is located between the second semiconductor region and the further heat spreader, wherein the passivation layer has a thickness of at most 200 nm, and wherein the passivation layer comprises at least one of the following materials: $Al_2O_3$, $SiO_2$, or $Si_3N_4$.

4. The semiconductor strip laser according to claim 3, wherein side surfaces of the strip waveguide are free from the passivation layer and the further heat spreader contacts the side surfaces at least in places.

5. The semiconductor strip laser according to claim 1, wherein the at least one heat spreader comprises one or more sublayers of a semiconductor material and is in direct contact with the second semiconductor region, which is p-doped, and wherein the semiconductor material of at least one of the one or more sublayers in undoped or n-doped.

6. The semiconductor strip laser according to claim 1, wherein the at least one heat spreader comprises at least two subregions of different materials, and wherein the subregions directly follow one behind the other in a direction away from the active zone and/or in a lateral direction away from the strip waveguide and/or along the waveguide direction.

7. The semiconductor strip laser according to claim 6, wherein at least one of the subregions has an average distance of at most 50 μm to a facet of the semiconductor body and directly adjoins the facet, and wherein the facet is a light exit surface of the semiconductor body and is oriented perpendicularly to the waveguide direction.

8. The semiconductor strip laser according to claim 1, wherein a metal layer is located between at least one of the at least one heat spreader and the semiconductor body, wherein the metal layer contacts the at least one heat spreader, and wherein the metal layer is not a solder.

9. The semiconductor strip laser according to claim 1, wherein the first and/or the second electric contact is electrically resistively conductive and comprises at least two sublayers that directly follow one after the other in a direction away from the strip waveguide, wherein the sublayer located closer to the strip waveguide comprises at least one of the following materials: ZnO, ITO, AlN, GaN, InN, AlGaN, InGaN, or AlInGaN, and wherein the sublayer located farther away from the strip waveguide comprises at least one of the following materials: Al, Au, Cr, Ni, Pd, Pt, or Ti.

10. A semiconductor component comprising:
a heatsink; and
at least one semiconductor strip laser according to claim 1,
wherein the semiconductor strip laser is soldered to the heatsink with a solder layer,
wherein the at least one heat spreader is located between the semiconductor body of the semiconductor strip laser and the solder layer, and
wherein the at least one heat spreader and the solder layer contact one another.

11. A semiconductor strip laser comprising:
a first semiconductor region of a first conductivity type of a semiconductor body;
a second semiconductor region of a second different conductivity type of the semiconductor body;
at least one active zone of the semiconductor body configured to generate laser radiation between the first and second semiconductor regions;
a strip waveguide formed at least in the second semiconductor region and providing a one-dimensional wave guidance along a waveguide direction of the laser radiation generated in the active zone during operation;
a first electric contact on the first semiconductor region;
a second electric contact on the second semiconductor region; and
at least one heat spreader dimensionally stably connected to the semiconductor body at least up to a temperature of 220° C., and having an average thermal conductivity of at least 50 W/m·K,
wherein the at least one heat spreader is connected to the semiconductor body in a solder-free manner so that no solder is located between the at least one heat spreader and the semiconductor body, wherein the at least one heat spreader comprises at least one of the following materials: SiC, Si, AlN, BN, BC, BeN, BeO, or diamond-like carbon, wherein the at least one heat spreader is in direct contact with the second semiconductor region, which is p-doped, wherein the at least one heat spreader is attached on both sides of the strip waveguide and contacts the strip waveguide, wherein the at least one heat spreader has a width, in a direction away from the strip waveguide, of at least 50 μm and extends entirely in the waveguide direction along the strip waveguide, and wherein the strip waveguide is formed in the semiconductor body exclusively in the second semiconductor region.

12. The semiconductor strip laser according to claim 11, wherein the at least one heat spreader is connected to the semiconductor body in a solder-free manner so that no solder is located between the at least one heat spreader and the semiconductor body, wherein the at least one heat spreader comprises at least one of the following materials: SiC, Si, AlN, BN, BC, BeN, BeO, or diamond-like carbon, wherein the at least one heat spreader is in direct contact with the second semiconductor region, which is p-doped, wherein the at least one heat spreader is attached on both sides of the strip waveguide and contacts the strip waveguide, wherein the at least one heat spreader has a width, in a direction away from the strip waveguide, of at least 50 μm and extends entirely in the waveguide direction along the strip waveguide, and wherein the strip waveguide is formed in the semiconductor body exclusively in the second semiconductor region.

13. The semiconductor strip laser according to claim 11, wherein, viewed in a plan view of the strip waveguide, the second electric contact covers the at least one heat spreader in places and contacts the at least one heat spreader in places, wherein the second electric contact comprises at least one of the following materials: Ag, Au, Cr, Ni, Pd, Pt, or Ti, and wherein the strip waveguide protrudes from the at least one heat spreader, in a direction away from the active zone.

14. The semiconductor strip laser according to claim 11, wherein the at least one heat spreader terminates flush with the second electric contact or protrudes from the second electric contact in a direction away from the active zone of the at least one heat spreader, and wherein the second electric contact entirely covers the strip waveguide, viewed in a plan view.

15. The semiconductor strip laser according to claim 11, further comprising a solder layer, wherein the solder layer is in direct contact to the second electric contact and to the at least one heat spreader, wherein solder layer entirely covers the second electric contact, and wherein the solder layer has a smaller expansion in a lateral direction than the semiconductor body.

16. The semiconductor strip laser according to claim 11, wherein the at least one heat spreader comprises at least one opening on the first semiconductor region, the semiconductor body being electrically contacted through the at least one opening by a solder.

17. A semiconductor strip laser comprising:
a first semiconductor region of a first conductivity type of a semiconductor body;
a second semiconductor region of a second different conductivity type of the semiconductor body;
at least one active zone of the semiconductor body configured to generate laser radiation between the first and second semiconductor regions;
a strip waveguide formed at least in the second semiconductor region and providing a one-dimensional wave guidance along a waveguide direction of the laser radiation generated in the active zone during operation;
a first electric contact on the first semiconductor region;
a second electric contact on the second semiconductor region; and
at least one heat spreader dimensionally stably connected to the semiconductor body at least up to a temperature of 220° C., and having an average thermal conductivity of at least 50 W/m·K,
wherein, viewed in a plan view of the strip waveguide, the second electric contact covers the at least one heat spreader in places and contacts the at least one heat spreader in places, wherein the second electric contact comprises at least one of the following materials: Ag, Au, Cr, Ni, Pd, Pt, or Ti, and wherein the strip waveguide protrudes from the at least one heat spreader, in a direction away from the active zone.

18. A semiconductor strip laser comprising:
a first semiconductor region of a first conductivity type of a semiconductor body;
a second semiconductor region of a second different conductivity type of the semiconductor body;
at least one active zone of the semiconductor body configured to generate laser radiation between the first and second semiconductor regions;
a strip waveguide formed at least in the second semiconductor region and providing a one-dimensional wave guidance along a waveguide direction of the laser radiation generated in the active zone during operation;
a first electric contact on the first semiconductor region;
a second electric contact on the second semiconductor region; and
at least one heat spreader dimensionally stably connected to the semiconductor body at least up to a temperature of 220° C., and having an average thermal conductivity of at least 50 W/m·K,
wherein the at least one heat spreader terminates flush with the second electric contact or protrudes from the second electric contact in a direction away from the active zone of the at least one heat spreader, and wherein the second electric contact entirely covers the strip waveguide, viewed in a plan view.

19. A semiconductor strip laser comprising:
a first semiconductor region of a first conductivity type of a semiconductor body;
a second semiconductor region of a second different conductivity type of the semiconductor body;
at least one active zone of the semiconductor body configured to generate laser radiation between the first and second semiconductor regions;
a strip waveguide formed at least in the second semiconductor region and providing a one-dimensional wave guidance along a waveguide direction of the laser radiation generated in the active zone during operation;
a first electric contact on the first semiconductor region;
a second electric contact on the second semiconductor region;
at least one heat spreader dimensionally stably connected to the semiconductor body at least up to a temperature of 220° C., and having an average thermal conductivity of at least 50 W/m·K; and
a solder layer, wherein the solder layer is in direct contact to the second electric contact and to the at least one heat spreader, wherein solder layer entirely covers the second electric contact, and wherein the solder layer has a smaller expansion in a lateral direction than the semiconductor body.

20. A semiconductor strip laser comprising:
a first semiconductor region of a first conductivity type of a semiconductor body;
a second semiconductor region of a second different conductivity type of the semiconductor body;
at least one active zone of the semiconductor body configured to generate laser radiation between the first and second semiconductor regions;
a strip waveguide formed at least in the second semiconductor region and providing a one-dimensional wave guidance along a waveguide direction of the laser radiation generated in the active zone during operation;
a first electric contact on the first semiconductor region;
a second electric contact on the second semiconductor region; and
at least one heat spreader dimensionally stably connected to the semiconductor body at least up to a temperature of 220° C., and having an average thermal conductivity of at least 50 W/m·K,
wherein the at least one heat spreader comprises at least one opening on the first semiconductor region, the semiconductor body being electrically contacted through the at least one opening by a solder.

* * * * *